United States Patent [19]

Kohji

[11] 4,399,387

[45] * Aug. 16, 1983

[54] ULTRASONIC WAVE TRANSDUCER

[75] Inventor: Toda Kohji, Yokosuka, Japan

[73] Assignee: TDK Electronics Co., Ltd., Tokyo, Japan

[ * ] Notice: The portion of the term of this patent subsequent to Oct. 30, 1996, has been disclaimed.

[21] Appl. No.: 215,902

[22] Filed: Dec. 12, 1980

Related U.S. Application Data

[63] Continuation of Ser. No. 953,374, Oct. 23, 1978, abandoned, which is a continuation-in-part of Ser. No. 844,291, Oct. 21, 1977, Pat. No. 4,173,009.

[30] Foreign Application Priority Data

| | | | |
|---|---|---|---|
| Nov. 21, 1977 | [JP] | Japan | 52-138981 |
| Nov. 21, 1977 | [JP] | Japan | 52-138982 |
| Dec. 6, 1977 | [JP] | Japan | 52-145636 |
| Dec. 6, 1977 | [JP] | Japan | 52-145637 |
| Dec. 21, 1977 | [JP] | Japan | 52-152966 |

[51] Int. Cl.$^3$ .............................................. H01L 41/08

[52] U.S. Cl. .................................... 310/334; 310/337; 367/164

[58] Field of Search ................................ 310/334-337; 128/660; 333/187, 191, 141, 142, 149; 73/596, 598, 602, 603, 605-607, 610, 618, 625-629, 632, 633, 642; 367/128, 141, 153-155, 157, 164

[56] References Cited

U.S. PATENT DOCUMENTS

| | | | |
|---|---|---|---|
| 2,875,355 | 2/1959 | Petermann | 310/334 |
| 3,086,195 | 4/1963 | Halliday | 310/334 X |
| 3,166,731 | 1/1965 | Joy | 310/334 X |
| 3,401,360 | 9/1968 | Schulz-De Bois | 310/334 X |
| 3,745,812 | 7/1973 | Korpel | 310/334 X |
| 3,875,550 | 4/1975 | Quate et al. | 367/155 X |
| 3,962,673 | 6/1976 | Desbois | 310/334 X |
| 4,034,332 | 7/1977 | Alais | 367/155 X |
| 4,075,516 | 2/1978 | Mattori et al. | 310/334 |

*Primary Examiner*—Mark O. Budd
*Attorney, Agent, or Firm*—Allison C. Collard; Thomas M. Galgano

[57] ABSTRACT

An ultrasonic wave transducer capable of generating a convergent ultrasonic sound beam has been found. The transducer comprises a piezoelectric substrate, at least one interdigital electrode group arranged on the surface of the piezoelectric substrate, each of said groups having a plurality of interdigital electrodes arranged in the longitudinal direction of the fingers of each interdigital electrode, said substrate being positioned in a liquid so that at least said interdigital electrodes contact with the liquid, and said electrodes being applied an alternating voltage with a predetermined phase difference thus providing a convergent sound beam in y-direction based upon the principle of interference between the sound beams, similar to the interference by a diffraction grating. Further, the non-uniform arrangement of the fingers of the interdigital electrodes provides the x-direction convergence, thus, an ultrasonic wave beam focusing at a single point is obtained.

6 Claims, 14 Drawing Figures

ULTRASONIC WAVE TRANSDUCER

This application is a continuation of application Ser. No. 953,374, filed Oct. 23, 1978, now abandoned, which is a continuation-in-part of application Ser. No. 844,291, filed Oct. 21, 1977, now U.S. Pat. No. 4,173,009, issued Oct. 30, 1979.

BACKGROUND OF THE INVENTION

The present invention relates to a transducer for generating ultrasonic wave energy by an ultrasonic wave apparatus, in particular relates to a transducer which can generate a convergent ultrasonic beam.

Although a medium is opaque optically, it is possible to view the internal structure of said medium as long as the medium is acoustically transparent; as in x-ray photography. Photographs produced using ultrasonic wave energy are applicable to those fields where the medium is optically opaque, including medical applications, microscopes, nondestructive testing, underwater observation, and/or earthquake research.

Some ultrasonic wave transducers for the generation of a focused ultrasonic wave have been proposed. Some of them utilize an acoustic phase shift plate, a circular array, an acoustic lens, or a photo-acoustic transducer. However, the above prior arts are not sufficient or complicated for focusing ultrasonic waves in the application of viewing the internal structure of a medium.

SUMMARY OF THE INVENTION

It is an object, therefore, of the present invention to overcome the disadvantages and limitations of the prior ultrasonic wave transducers by providing a new and improved ultrasonic wave transducer.

Another object of the present invention is to provide an ultrasonic wave transducer which focuses ultrasonic waves on a single line.

Still another object of the present invention is to provide an ultrasonic wave transducer which focuses ultrasonic waves on a single point.

Still another object of the present invention is to provide an ultrasonic wave transducer which provides the ultrasonic wave in a scanning mode.

The above and other objects are attained by an ultrasonic wave transducer comprising a piezoelectric substrate, at least one interdigital electrode group arranged on the surface of the piezoelectric substrate, each of said groups having a plurality of interdigital electrodes arranged in the longitudinal direction of the fingers of each interdigital electrode, and said electrodes being applied an alternating voltage with a predetermined phase difference on the condition that said interdigital electrodes contact with a liquid. The period between the fingers of the interdigital electrodes may be either uniform or non-uniform, and uniform electrodes provide a sound beam convergent on a single line, and non-uniform electrodes provide a sound beam convergent on a single point.

BRIEF DESCRIPTION OF THE DRAWINGS

The foregoing and other objects, feature, and attendant advantages of the present invention will be better appreciated as the same become better understood by means of the following description and accompanying drawings wherein.

DESCRIPTION OF THE PREFERRED EMBODIMENTS

Figure 1:
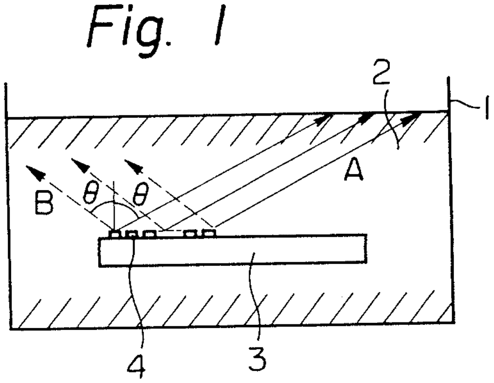
FIG. 1 shows the embodiment of the structure of the present ultrasonic wave transducer.

FIG. 1 shows the structure of the present ultrasonic wave transducer. In FIG. 1, the liquid 2 is contained in the housing 1, and the piezoelectric material 3 having the interdigital electrode 4 on the surface of the same is provided in the liquid 2. Some possible examples of the liquid 2 are water, ether, acetone, and glycerine.

Figure 2A:
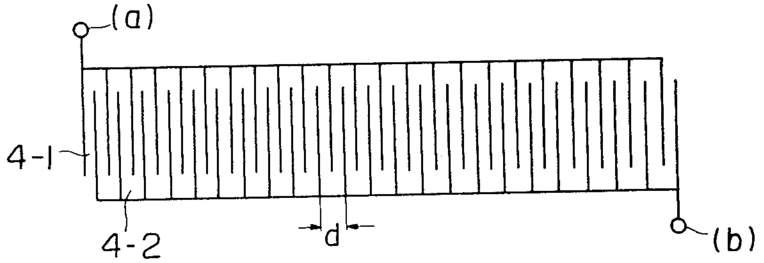
FIG. 2A and FIG. 2B show some embodiments of the interdigital electrode.
Figure 2B:
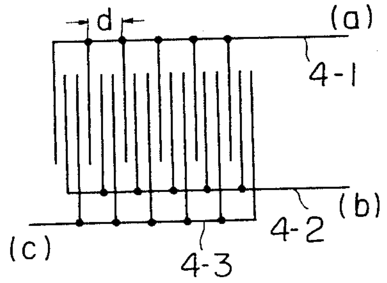

Some of the structures of the interdigital electrode 4 are shown in FIGS. 2A and 2B. FIG. 2A shows a single phase (bi-phase) electrode in which a pair of comb-shaped electrodes 4-1 and 4-2 are interdigitally arranged so that each finger of each electrode appears alternately, and an alternating voltage of bi-phase is supplied to the pair of terminals (a) and (b) of the electrodes. FIG. 2B shows a three phase electrode in which three comb-shaped electrodes 4-1, 4-2 and 4-3 are interdigitally arranged on the surface of the piezoelectric material 3 so that each finger of each electrode is alternately arranged and the period of each finger belonging to the same electrode is three, and a three phase alternating voltage is applied to the terminals (a), (b) and (c).

The single phase electrode in FIG. 2A provides a pair of ultrasonic wave beams directed in opposite directions to each other (the direction indicated by the arrows A and B in FIG. 1). While, the three phase electrode in FIG. 2B can provide a single ultrasonic wave beam in a predetermined direction (the direction indicated by the arrow A or B in FIG. 1).

The preferable material for the electrode is, for instance, a combination of chrome(Cr) and gold(Au). Some of the preferable materials for the piezoelectric transducer are $LiNbO_3$, quartz crystal, $Bi_{12}GeO_{20}$, and a ceramic of the $Pb(Zr, Ti)O_3$ group (for instance "91-A" produced by TDK Electronics., Tokyo Japan).

The relationship of the period (d) of each finger of an interdigital electrode and the direction ($\theta$) of the ultrasonic wave beams with maximum power is defined by the formula;

$$\sin\theta = Vw/(f.d) = \lambda_f/d$$

where $\lambda_f$ is the wave length of a sound wave of the frequency f in the liquid, Vw is the propagation velocity of the sound wave in the liquid, and f is the frequency.

From the above formula, it should be appreciated that provided the period (d) is constant, parallel ultrasonic wave beams in the direction $\theta$ are obtained from the interdigital electrode.

Next, the following table shows the experimental result of the angle ($\theta$) of the sound beam radiation for some combination of piezoelectric material and liquid.

| Liquid and sound velocity (20°C.) | Piezoelectric material and surface acoustic wave velocity | | | |
|---|---|---|---|---|
| | $LiNbO_3$ 131° rot.Y, X (4000m/sec) | Quartz Y, X (3159m/sec) | $Bi_{12}GeO_{20}$ (111), (110) (1708m/sec) | Piezoelectric Ceramic (91A) (2100m/sec) |
| Water (1482.6m/sec) | 21.8° | 28.0° | 60.24° | 44° |
| Ether (1006m/sec) | 14.6° | 18.6° | 36° | 28.2° |
| Acetone (1190m/sec) | 17.3° | 22.1° | 44.2° | 34.0° |
| Glycerine (1923m/sec) | 28.7° | 37.5° | / | 64.5° |

It is apparent from the above table that when a small value of $\theta$ is desired, a combination of a liquid of low sound velocity and piezoelectric material of high surface wave velocity is preferable.

Figure 3:
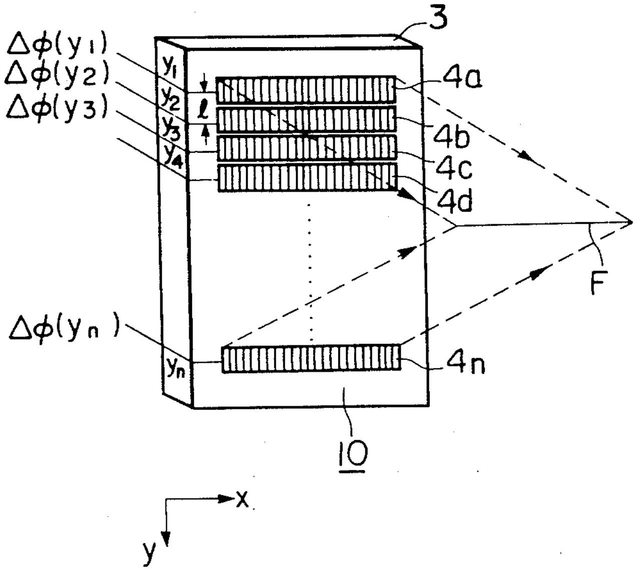
FIG. 3 shows the embodiment of the structure of the present ultrasonic wave transducer.

FIG. 3 shows the structure of the ultrasonic wave transducer according to the present invention. In FIG. 3, a plurality of interdigital electrodes 4*a*, 4*b*, 4*c*, . . . are mounted on the piezoelectric substrate 3. Said interdigital electrodes compose a group 10 of electrodes. It is supposed in FIG. 3 that the period (d) between each finger of each interdigital electrode is constant or uniform, and the interdigital electrodes are positioned in the longitudinal direction of fingers of the electrodes. The liquid is omitted in FIG. 3 for the sake of simplicity of the drawing, although the interdigital electrodes actually contact the liquid.

Since the period (d) of the fingers in FIG. 3 is constant, the ultrasonic wave beams do not converge or focus in the x-direction, but a plurality of parallel beams, are obtained. On the other hand, the plurality of interdigital electrodes operate like a diffraction grating in the y-direction. Accordingly, when an electrical signal having a predetermined phase difference is applied to an interdigital electrode, the interdigital electrode generates a sound wave beam with a definite phase. Thus, on the whole, each sound beam, each of which has its own phase, is summed up, and the beams converge on the line F which is parallel to the x-axis.

Provided that the position in the y-direction of the n'th interdigital electrode is $y_n$, the electrical frequency f applied to the interdigital electrode is $2\pi\omega_O$, and the phase of the electrical signal applied to the electrode is $\Delta\phi(y_n)$, then the sound wave beam has the phase $\phi_n(y,x)$ when said beam arrives at the line F, the coordinates of which are (y, x). Said phase $\phi_n(y,x)$ is obtained by the formula below where $v_w$ is the sound velocity in the liquid and (t) is a time.

$$\phi_n(y,x) = \omega_o\left[t - \frac{x}{v_w} - \frac{(y_n - y)^2}{2xv_w}\right] + \Delta\phi(y_n) = \quad (1)$$

-continued $$\omega_o\left[t - \frac{x}{v_w} - \frac{y^2}{2xv_w}\right] + \omega_o\left(\frac{y_n \cdot y}{xv_w} - \frac{y_n^2}{2xv_w}\right) + \Delta\phi(y_n)$$

When the formula below is satisfied, the sound wave beams from all the interdigital electrodes have the same phase, and converge on a single line F.

$$\omega_o\left(\frac{y_n y}{xv_w} - \frac{y_n^2}{2xv_w}\right) + \Delta\phi(y_n) = 2m\pi \quad (2)$$

where m is an integer, and $y_n = nl$ is satisfied when the length between each interdigital electrodes is (l).

Accordingly, when electrical signals having phases which satisfy the above formula are applied to the interdigital electrodes in FIG. 3, a sound wave beam which converges on a single line is obtained. In FIG. 3, the phase of the interdigital electrode 4*a* is $\Delta\phi(y_1)$, that of electrode 4*b* is $\Delta\phi(y_2)$, and the phase of the electrode 4*n* is $\Delta\phi(y_n)$.

An electrical signal having a desired phase can be obtained using a conventional surface wave delay line having tapes, or conventional LC circuits.

An experiment using 91A (produced by TDK Electronics Co.,) as the piezoelectric substrate and ten interdigital electrodes, the period of the fingers of which is 428 $\mu$m, was carried out. When an electrical signal of the frequency 5.0 $MH_z$ with the phase differences satisfying the above formula is applied to the interdigital electrodes, a sound wave beam which converges at a single line in a plane paralleled to the surface of the interdigital electrodes is obtained. The length between said plane and the surface of the interdigital electrode is 20 cm.

Figure 4:
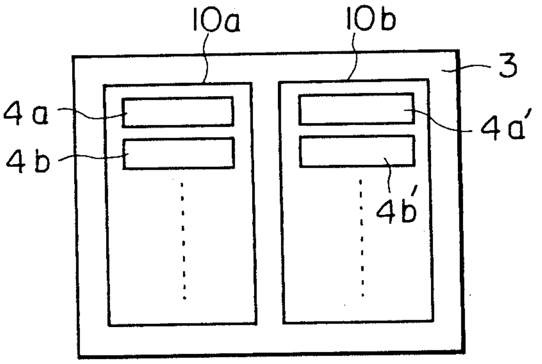
FIG. 4 shows another structure of the present ultrasonic wave transducer.

FIG. 4 shows another structure of the ultrasonic wave transducer according to the present invention, in which a plurality of electrode groups 10*a* and 10*b* are provided on a single piezoelectric substrate 3. The electrode group 10*a* has a plurality of interdigital electrodes 4*a*, 4*b*, . . . 4*n* as shown in FIG. 3, and the other electrode group 10*b* has a plurality of interdigital electrodes 4*a*', 4*b*', . . . 4*n*'. It is supposed that the period (d) of the fingers of the interdigital electrodes of the group 10*a* is different from that of the group 10*b*. As the focal length of the ultrasonic wave beam depends upon the period of the fingers of the interdigital electrode and the frequency of the electrical signal applied to the electrode, the ultrasonic wave transducer in FIG. 4 can provide an ultrasonic wave beam the focal length of which is adjustable by switching an electrical signal. Of course, more than three electrode groups can be mounted on a single substrate to provide more than three kinds of sound beams.

Now, the effect of the period of the interdigital electrode will be explained in accordance with FIG. 5. As mentioned before, the relationship between the wavelength $\lambda_f$ in the liquid of the sound wave of the frequency f and the direction ($\theta$) of the strongest sound beam is shown in the following formula which coincides with the experimental results of the inventor.

$$\sin\theta = V_w/(f.d) = \lambda_f/d \quad (3)$$

where d is the periodic length of the electrode. Therefore, the condition that the sound generated at each point of the electrode focuses at the point P, that is to say, the condition that the sound generated at each point passes the point P and is in phase at point P, is shown in the formula (4) below.

$$r_n^2 = R_n^2 - L^2 = k_1 n \lambda_f L + k_2 n^2 \lambda_f^2 \quad (4)$$

where $r_n$ is the distance between the n'th electrode and the point Q, $R_n$ is the distance between the n'th electrode and the point P, and $k_1$ and $k_2$ are constant. The set of values ($k_1$, $k_2$) is $(1,\frac{1}{4})$ for the bi-phase electrode shown in FIG. 2(A), and is $(\frac{2}{3}/\ 1/9)$ for the three phase electrode shown in FIG. 2(B). The desired period of the electrode can be obtained by calculating the formulas (3) and (4) using a computer.

Figure 6:
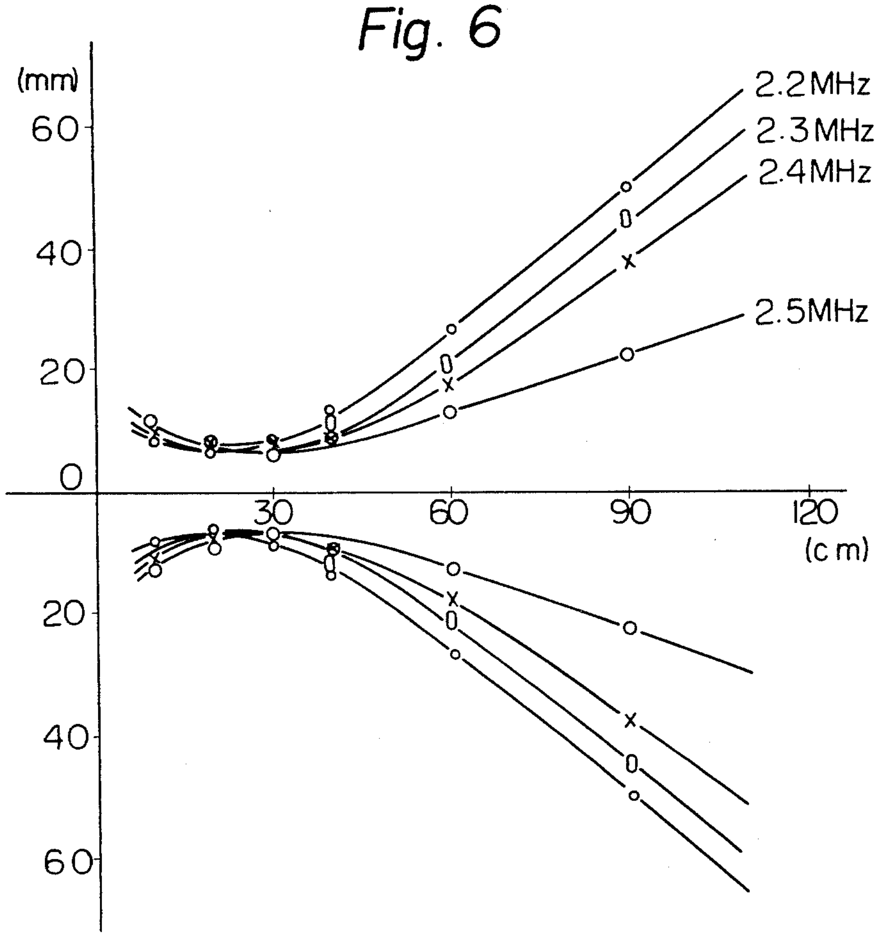
FIG. 6 and FIG. 7 show the curves showing the experimental results of the present ultrasonic wave transducer.
Figure 7:
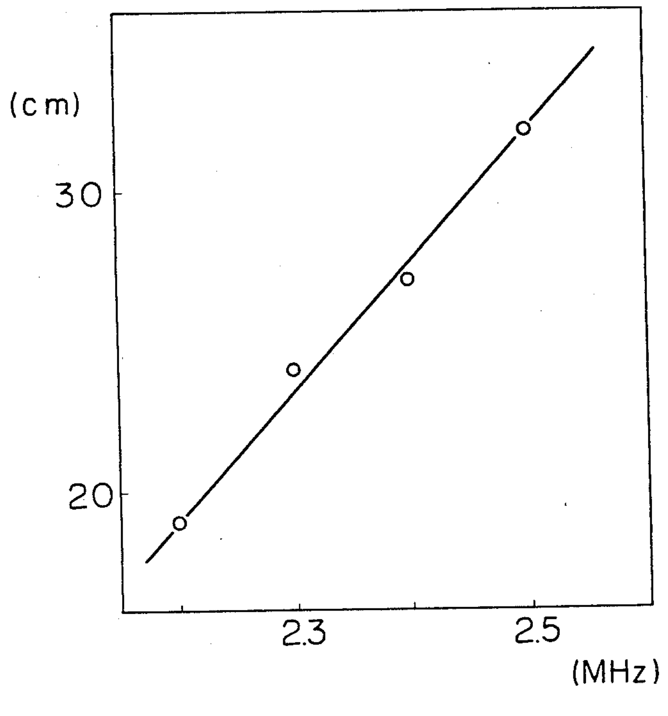

It is also apparent from the above explanation that the characteristics of the convergence of the sound wave depends upon the frequency of the sound wave. FIGS. 6 and 7 show the experimental results of the focus characteristics of a transducer designed for operation at 2.5 MHz with a combination of a 91-A piezoelectric ceramic and water. In FIG. 6, the horizontal axis shows the distance from the sound source, and the vertical axis shows the width of the beam. The curves in FIG. 6 show the shape of the sound wave beam with the parameter of frequency, and those curves are obtained by measuring the directivity of the sound beam at various frequencies, and the shape of the sound beam is obtained from the directivity. The focal length at each frequency can be calculated from the curves in FIG. 6, and the result is shown in FIG. 7.

Further, the experiment shows that the present transducer satisfies the analogical relationship, that is to say, the transducer of the half size of the electrode pattern shows the focal length 16 cm at center frequency 5 MHz and beam width 3.8 mm. Further, the focal length for each frequency varies similarly.

According to the above explanation, a non-uniform period of interdigital electrode fingers on the surface of the piezoelectric material in the liquid can provide a convergent ultrasonic wave beam by providing an alternating voltage to said electrode.

Figure 8:
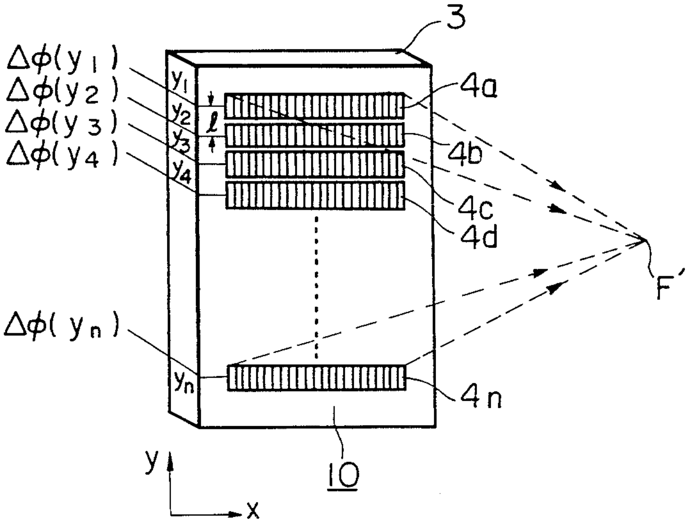
FIG. 8 shows another structure of the present ultrasonic wave transducer.

FIG. 8 shows another structure of the ultrasonic wave transducer according to the present invention, in which sound wave beams converge at a single point F'. In FIG. 8, a plurality of interdigital electrodes 4*a*, 4*b*, 4*c*, . . . are mounted on the piezoelectric substrate 3. Said interdigital electrodes compose a group 10 of electrodes. The period between each finger in each interdigital electrode satisfies the formula (4) mentioned earlier, and each interdigital electrode is positioned in the longitudinal direction of fingers of the electrodes. The liquid is omitted in FIG. 3 for the sake of simplicity of the drawing, although the interdigital electrodes actually contact a liquid.

Figure 5:
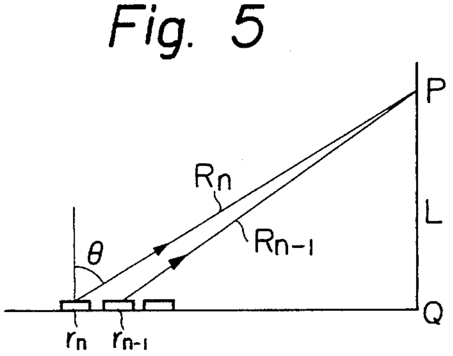
FIG. 5 shows the drawing for the explanation of the operational principle of the convergence in the x-direction according to the present invention.

Since the period of the fingers in FIG. 8 satisfies the formula (4) explained in accordance with FIG. 5, the ultrasonic wave beams converge in the x-direction, and a plurality of convergent beams, the number of which corresponds to the number (n) of the interdigital electrodes, are obtained. At the same time, the beams converge in the y-direction by applying electrical signals having the phase differences defined by the formula (2) explained with FIG. 3. Accordingly, the beams converge both in the x-direction and the y-direction, and thus, converge at the single point F'.

It should be appreciated that the arrangement shown in FIG. 4 using an interdigital electrode group having the non-uniform period explained in FIG. 8 is possible. In that case, the characteristics of the beams which focus at a single point can be switched by controlling the phase difference of the electrical signal applied to the interdigital electrodes and by switching the interdigital electrode groups.

If the surface of an interdigital electrode is covered with a protection film composed of, for instance, silicon rubber, the electrode is protected from chemical deterioration.

Figure 9A:
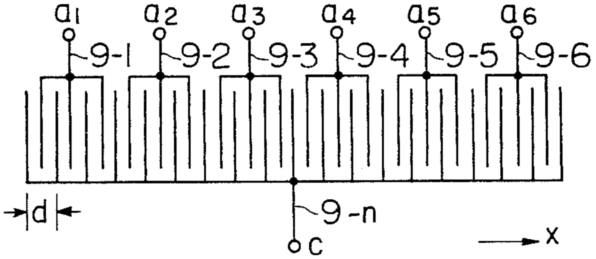
FIG. 9A and FIG. 9B show another arrangement of the interdigital electrode according to the present invention.
Figure 9B:
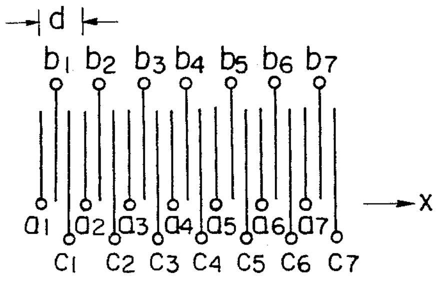

FIG. 9A and FIG. 9B show another arrangement of an interdigital electrode according to the present invention. FIG. 9A shows a bi-phase interdigital electrode and FIG. 9B shows a three phase interdigital electrode. It is supposed that the period of the fingers of the interdigital electrodes in both FIGS. 9A and 9B is constant, thus, a parallel beam which does not converge is obtained.

The interdigital electrodes in FIG. 9A comprise a common electrode 9-n, and other electrodes 9-1 through 9-6. Each electrode 9-1 through 9-6 connects a predetermined number of fingers as shown in FIG. 9A (in the embodiment, three fingers are connected together but it should be appreciated that a single finger can compose an electrode). The three phase interdigital electrode shown in FIG. 9B has a plurality of finger groups ($a_i$, $b_i$, $c_i$) and only a single group of fingers ($a_i$, $b_i$, $c_i$) receive the three phase electrical signal one at a time.

Figure 10A:
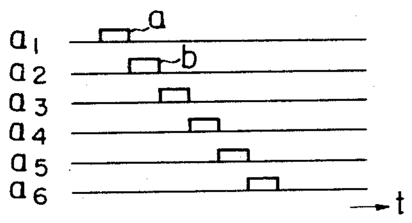
FIG. 10A and FIG. 10B show the waveforms of the electrical signals applied to the electrodes shown in FIG. 9A and FIG. 9B, respectively.
Figure 10B:
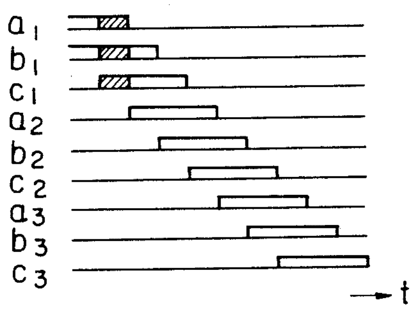

FIG. 10A shows the waveform of the electrical signal applied to the longitudinal electrode shown in FIG. 9A, and FIG. 10B shows the wave form of the electrical signal applied to the interdigital electrode shown in FIG. 9B.

In FIG. 10A, first, an electrical pulse is applied to the common electrode 9-n and the first electrode 9-1 (a), and then the next electrical pulse is applied between the common electrode 9-n and the second electrode 9-2 (b). Similarly, the electrical pulse on an interdigital electrode 9-1 through 9-6 shifts from the electrode 9-1 to the electrode 9-6 through 9-2, 9-3, 9-4 and 9-5. Accordingly, sound wave beams generated by the interdigital electrodes also shift in the x-direction. The shifting sound wave beams can be utilized for ultrasonic scanning of the surface of an object, although they do not focus.

On the other hand, in FIG. 10B, three phase electrical signals are applied to the finger group ($a_i$, $b_i$, $c_i$) and the electrical signal shifts from the first finger group ($a_1$, $b_1$, $c_1$) to ($a_2$, $b_2$, $c_2$), and then to ($a_3$, $b_3$, $c_3$), ($a_4$, $b_4$, $c_4$) . . . ($a_n$, $b_n$, $c_n$).

It should be appreciated from FIG. 10B that only three fingers receive the electrical signal at the same time, as shown by the shaded portion in FIG. 10B.

The arrangement of FIG. 9B and FIG. 10B can also provide a shifting ultrasonic wave beam which can scan the surface of an object. It should be appreciated that the arrangement in FIG. 9A provides a pair of sound wave beams as a bi-phase signal is applied, and the arrangement in FIG. 9B provides a single sound wave beam as a three phase electrical signal is applied.

Figure 11:
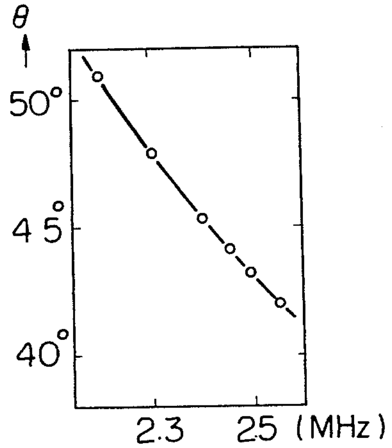
FIG. 11 is the curve showing the experimental result of the embodiment shown in FIG. 9A and FIG. 9B.

FIG. 11 shows the experimental result of the interdigital electrodes in FIG. 9A and 9B, and shows the relationship between the electrical frequency applied to the electrodes and the direction ($\theta$) of the sound beam. As apparent from FIG. 11, the direction of the sound beam can be controlled by controlling the frequency applied to the electrodes, and the effect of the formula (3) is proved.

The shifting electrical signal for the arrangements in FIG. 9A and FIG. 9B can be provided through a delay line having a plurality of taps, and each tap is connected to an electrode finger $a_i$.

As apparent from the above explanation, according to the present invention, the interdigital electrode on the surface of the piezoelectric material in the liquid can provide a convergent ultrasonic wave beam by providing an alternating voltage to said electrode.

The application field of the present invention is not limited to photography or viewing the internal structure of a material, but is also applicable to other fields which require a convergent sound beam; for instance, liquid can be sprayed by focusing the sound beam at the boundary area of liquid and air.

From the foregoing it will now be apparent that a new and improved ultrasonic wave transducer has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An ultrasonic wave transducer comprising: a piezoelectric substrate having a planar surface and at least one interdigital electrode group arranged on said surface of said piezoelectric substrate, each of said groups having a plurality of interdigital electrodes, each electrode of which has a plurality of longitudinally-extending fingers, said plurality of electrodes being arranged in a row extending in the longitudinal direction of said fingers of each interdigital electrode, and said electrodes having electrical terminals for applying an alternating voltage thereto with a predetermined phase difference between each of said interdigital electrodes, so that when said transducer is disposed so that said interdigital electrodes thereof contact with a liquid, an ultrasonic wave is generated from said electrodes into the liquid, and wherein the period between said fingers of said electrodes satisfies $$r_n^2 = k_1 n\lambda_f L + k_2 n^2 \lambda_f^2$$

where, as defined with respect to cartesian coordinates, $r_n$ is the abscissa length between the n'th finger of the electrode and the focal point, $\lambda_f$ is the wavelength of the sound wave in a liquid, L is the ordinate length between the n'th electrode and the focal point, and $k_1$ and $k_2$ are constants.

2. An ultrasonic wave transducer according to claim 1, wherein said interdigital electrode is a three phase interdigital electrode and said alternating voltage is a three phase voltage.

3. An ultrasonic wave transducer according to claim 1, wherein said interdigital electrode is a bi-phase interdigital electrode and said alternating voltage is single phase voltage.

4. An ultrasonic wave transducer according to claim 1, wherein the period between fingers and the frequency of the electrical signal applied to the first group of interdigital electrodes are different from those of the second interdigital electrode group.

5. A method for generating a convergent ultrasonic wave beam comprising the steps of: positioning a piezoelectric substrate having a planar surface and at least one interdigital electrode group composed of a plurality of interdigital electrodes, each electrode of which has a plurality of longitudinally-extending fingers, said group being arranged on said surface of the substrate, in a liquid so that at least said interdigital electrodes contact with said liquid, said plurality of interdigital electrodes being arranged in a row extending in the direction of said interdigital electrodes, and each of said electrodes being applied on alternating voltage of a predetermined frequency with the phase difference defined below $$\omega_o\left(\frac{y_n y}{x v_w} - \frac{y_n^2}{2x v_w}\right) + \Delta\phi(y_n) = 2m\pi$$

where m is an integer, $\omega_O$ is an angular frequency of the electrical signal, $v_w$ is the sound velocity in the liquid, $Y_n$ is the length between the n'th interdigital electrode and the origin point, $\Delta\phi(y_n)$ is the phase of the electrical signal applied to the n'th interdigital electrode, and (y,x) are coordinates, and wherein the period between said fingers of said electrodes satisfies $$r_n^2 = k_1 n\lambda_f L + k_2 n^2 \lambda_f^2$$

where, as defined with respect to cartesian coordinates, $r_n$ is the abscissa length between the n'th finger of the electrode and the focal point, $\lambda_f$ is the wavelength of the sound wave in a liquid, L is the ordinate length between the n'th electrode and the focal point, and $k_1$ and $k_2$ are constants.

6. An ultrasonic wave transducer according to claim 5, wherein said liquid is one selected from the group of water, ether, acetone and glycerine.

* * * * *